(12) United States Patent
Dykstra et al.

(10) Patent No.: US 11,936,374 B1
(45) Date of Patent: Mar. 19, 2024

(54) DRIVER WITH BUILT-IN SELF TESTING OF SWITCH STATUS

(71) Applicant: pSemi Corporation, San Diego, CA (US)

(72) Inventors: Jeffrey A. Dykstra, Chicago, IL (US); Jaroslaw Adamski, Chicago, IL (US); Smita Kanikaraj, San Diego, CA (US); Douglas Lacy, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/934,787

(22) Filed: Sep. 23, 2022

(51) Int. Cl.
*H03K 17/56* (2006.01)

(52) U.S. Cl.
CPC ................................ *H03K 17/56* (2013.01)

(58) Field of Classification Search
CPC .... H03K 17/56; H03K 17/693; H03K 17/102; H03K 17/687; H03K 2217/0018; H03K 17/063; H03K 17/145; H03K 17/165; H03K 17/6874; H03K 2217/0054; H04B 1/48; H04B 1/44; H01L 27/1203; H01L 27/0629; H01L 21/263; H01L 21/84; H01L 2224/48227; H01L 23/66; H01L 27/092; H01L 27/12; H01L 27/124; H01L 2924/15192
See application file for complete search history.

(56) References Cited

U.S. PATENT DOCUMENTS

| | | | |
|---|---|---|---|
| 6,804,502 B2 | 10/2004 | Burgener et al. | |
| 8,605,531 B2 | 12/2013 | Kau | |
| 2008/0025080 A1 | 1/2008 | Chan et al. | |
| 2010/0260076 A1* | 10/2010 | Corman | H04B 1/44 343/756 |

(Continued)

FOREIGN PATENT DOCUMENTS

| | | |
|---|---|---|
| WO | 03/096177 A1 | 11/2003 |
| WO | 2022/172277 A1 | 8/2022 |

OTHER PUBLICATIONS

International Search Report and Written Opinion issued for International Application No. PCT/US2023/032722 filed Sep. 14, 2023 on behalf of PSEMI Corporation. dated Dec. 21, 2023. 13 pages.

*Primary Examiner* — Lincoln D Donovan
*Assistant Examiner* — Tyler J Pereny
(74) *Attorney, Agent, or Firm* — Steinfl + Bruno LLP

(57) ABSTRACT

Methods and devices for reading and programming a state of a switch device are presented. Reading of the state is provided by measuring a resistance of the switch via injection of a current. If a measured resistance does not correspond to a resistance of an expected state, then the switch is reprogrammed, and the state reread. The switch device may form part of a complex switch circuit that includes a combination of shunt and through switch devices. Currents injected into external loads coupled to the switch circuit increase accuracy in reading of the state. Further accuracy in reading of the state of a through switch device is provided by provision of a bypass path to a shunt switch device. The (Continued)

complex switch circuit may be implemented as a SPDT switch including two branches, each branch including a shunt and a through switch device. Several types of switch devices, such as phase-change material (PCM) devices may be implemented.

20 Claims, 7 Drawing Sheets

(56) References Cited

U.S. PATENT DOCUMENTS

| | | |
|---|---|---|
| 2010/0328995 A1 | 12/2010 | Shih et al. |
| 2016/0116345 A1* | 4/2016 | Furtner .................... G01K 7/01 374/178 |
| 2017/0363676 A1* | 12/2017 | Shapiro .............. G01R 31/2621 |
| 2020/0059220 A1* | 2/2020 | El-Hinnawy ......... H04L 5/1461 |
| 2022/0190591 A1* | 6/2022 | Wang ................... H02H 7/1257 |
| 2022/0199343 A1 | 6/2022 | Taddiken et al. |

* cited by examiner

DRIVER WITH BUILT-IN SELF TESTING OF SWITCH STATUS

TECHNICAL FIELD

The present disclosure is related to electronic circuits, in particular switch circuits arrangements and, more particularly, drivers with built-in self-testing of switch status.

BACKGROUND

Programming of a switch device for operation according to an OFF state or ON state of the switch device can be unreliable. In particular, when programming the switch device to a desired state, an effective state of the switch device may not be the expected state, as the switch device may switch only partially or may not switch at all. As a consequence, there is a need to verify whether or not a state of a switch device is the expected state.

The above problem may occur in bi-state devices, inclusive of MEMS (micro-electromechanical system) switches and PCM (phase-change material) switches. A PCM switch consists of a volume of phase-change material having two electrical terminals and an adjacent heater, such as a resistor. Under stimulation of thermal energy generated by the heater, the PCM switch can be thermally transitioned between a high-resistivity amorphous state of the phase-change material that defines an OFF state (e.g., high resistance between the two electrical terminals) of the switch, and a low-resistivity crystalline state of the phase-change material that defines an ON state (e.g., low resistance between the two electrical terminals) of the switch. Such thermal energy may be provided by current pulses having specific waveforms, with parameters such as amplitude and duration, conducted through the heater/resistor.

Any variation in the waveforms combined with aging and/or degradation of switching performance of the phase-change material may cause unreliable switching of the PCM switch. The teachings according to the present disclosure address such unreliability, together with similar unreliabilities of other types of switches.

SUMMARY

According to a first aspect of the present disclosure, switch circuit arrangement is provided, comprising: a control circuit; a measurement circuit coupled to the control circuit, the measurement circuit comprising a current source; and a switch coupled to the measurement circuit, wherein the control circuit comprises a read mode of operation that is configured to: i) activate the current source to inject current through the switch, and ii) based on the current injected through the switch, read, through the measurement circuit, a resulting voltage to measure a programming status of the switch.

According to a second aspect of the present disclosure, a switch circuit arrangement is provided, comprising: a control circuit; a plurality of measurement circuits coupled to the control circuit, each measurement circuit comprising a current source; and a corresponding plurality of switches respectively coupled to measurement circuits of the plurality of measurement circuits, wherein the control circuit comprises a read mode of operation that is configured, selected switch by selected switch, to: i) activate the current source to inject current through the selected switch, and ii) based on the current injected through the selected switch, read, through the measurement circuit, a resulting voltage to measure a programming status of the selected switch.

According to a third aspect of the disclosure, a switch circuit arrangement is provided, comprising: a state machine control arrangement; a plurality of measurement circuits coupled to the state machine control arrangement, each measurement circuit comprising a current source; and a corresponding plurality of switches respectively coupled to measurement circuits of the plurality of measurement circuits, wherein the state machine control arrangement comprises a1) a reading state that is configured, selected switch by selected switch, to: i) activate the current source to inject current through the selected switch, and ii) based on the current injected through the selected switch, read, through the measurement circuit, a resulting voltage to measure a programming status of the selected switch, and b1) a programming state that is configured, selected switch by selected switch, to: i) generate first control pulses to program each switch of the plurality of switches in a first state; and ii) generate second control pulses to program each switch of the plurality of switches in a second state.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

The present disclosure provides a means to measure a resistance of a switch device indicative of an ON or OFF state of the device, such as a PCM device, and further program the state of the device, if needed. While the description of the figures will often make reference to PCM devices/switches, the teachings of the present disclosure are also intended to be applicable to bi-state devices in general, for example MEMS switches, having a first state measurable as a first resistance value and a second state measurable as a second resistance value.

Figure 1:
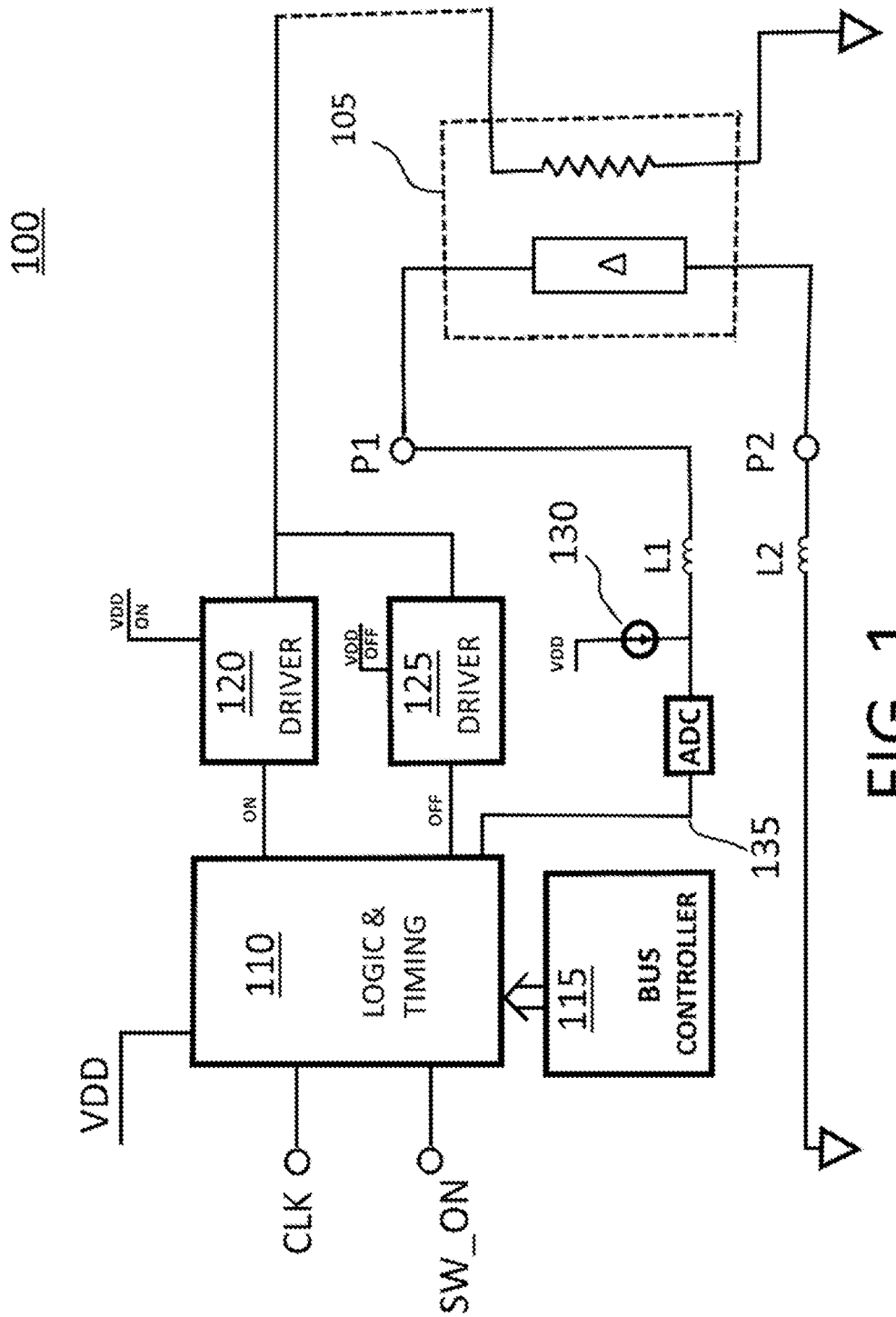
FIG. 1 shows a simplified block diagram of a circuital arrangement in accordance with the present disclosure that is configured to program in a state of a switch device and read the state of the switch device.

FIG. 1 shows a simplified block diagram of a circuital arrangement (100) in accordance with the present disclosure that is configured to program in a state of a switch device (105) and read the state of the switch device (105). In particular, the circuital arrangement (100) may generate pulse waveforms to program in an ON or OFF state of a PCM device (105) having input/output ports (e.g., terminals) P1, P2. A control circuit (110), e.g., a logic and timing circuit, generates ON and OFF pulse waveforms for drivers (120, 125) to accordingly program the PCM device (105) in a desired state. As shown in FIG. 1, the control circuit (110) may be coupled to a controller circuit (115) (e.g., via SPI or MIPI radio frequency front-end control interface, RFFE) for reception of control commands that may dictate configuration/state of the PCM device (105).

In order to provide DC measuring of the resistance of the PCM device (105), or in other words the resistance between ports P1 and P2, RF isolation from ports P1 and P2 of the PCM device (105) is provided through isolation inductors L1 and L2. Apart from a programming mode of operation, control circuit (110) also operates according to a reading mode. In particular, injection of a (resistance) measuring current into e.g., port P1 through the inductor L1, is provided, for example, by a measurement circuit including a current source (130). In this way, an analog DC voltage resulting from conduction of the measuring current through the switch resistance can be measured, and the current state of the PCM device (105) based on a high switch resistance or a low switch resistance can be determined. In particular, the analog voltage value is converted to a digital value through an analog-to-digital converter (ADC) of the measurement circuit and then sent (135) to the logic and timing circuit (110). While only a single bit ADC may be required for the purposes of the diagram of FIG. 1, embodiments are also possible where ADCs with more than one bit are implemented for better resolution, as later explained in more detail.

FIG. 1 shows one driver (120, 125) per switch state, wherein driver (120) is configured to process ON pulse waveforms generated by the control circuit (110) to program the switch (105), and driver (125) is configured to process OFF pulse waveforms generated by the control circuit (110) to program the switch (105). However, other configurations are also possible, such as a single driver for generating both waveforms. An example of such drivers is provided, for example, in U.S. patent application Ser. No. 17/815,193, filed on Jul. 26, 2022 and entitled "Integrated PCM Driver", incorporated herein by reference in its entirety.

Figure 3:
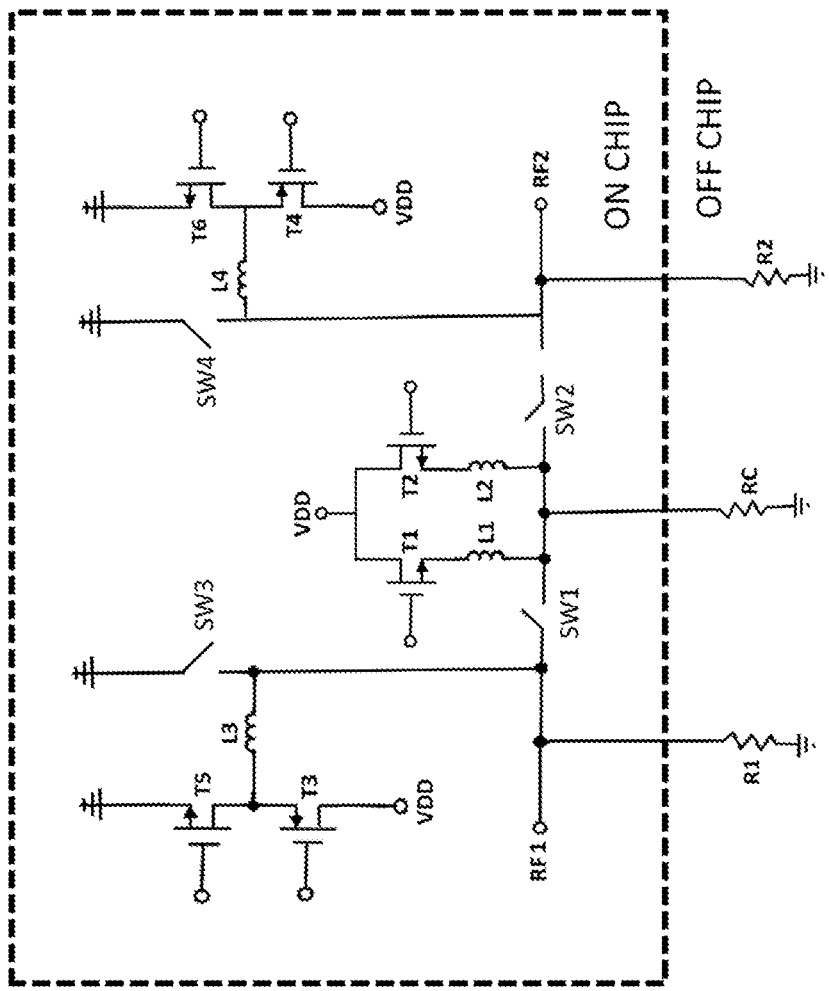
FIG. 3 shows a single-pole double-throw (SPDT) switch circuit according to an embodiment of the present disclosure.

The teachings according to the present disclosure may equally apply to a shunt PCM device (105) (e.g., SW3 or SW4 of FIG. 3), or a through PCM device (e.g., SW1 or SW2 of FIG. 3). As will be described later, combinations of shunt and through PCM devices can be used in branches of more complex switches to provide operation according to, for example, a single-pole single-throw (SPST) switch, a single-pole double-throw (SPDT) switch, a single-pole multi-throw (SPMT) switch or any known complex switch configuration.

The information acquired by the logic and timing circuit (110) through PCM device state measurement signal (135) is processed in order to perform a self-test built in the circuit (110). The built-in self-test performed herein will be also called BIST (i.e., built-in self-test) throughout the present disclosure. In general, the processing steps performed in accordance with the present disclosure can be defined as a list of states operated through a state machine, an implementation of which can be provided within the logic and timing circuit (110) of FIG. 1.

Figure 2:
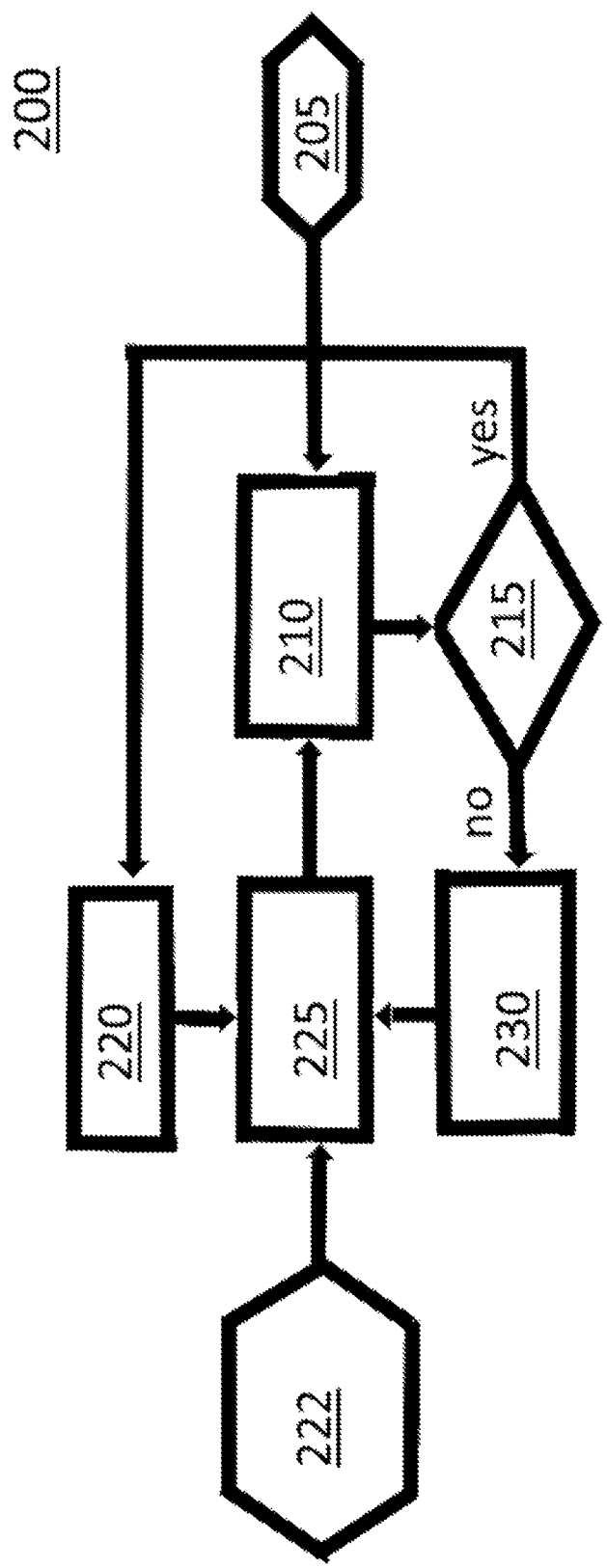
FIG. 2 shows various processing states and steps performed by a state machine for controlling operation of a switch device in accordance with an embodiment of the present disclosure.

An exemplary overview of the processing states and steps performed in accordance with an embodiment of the present disclosure is shown in the state machine (200) of FIG. 2. After an initial power-on reset (POR) operation (205), measuring (210) of the state of a particular switch device (e.g., a PCM device) is performed through the steps and devices involved in the measuring phase described in FIG. 1 above, followed by a determination step (215). In particular, if the measured state matches the expected state (YES), then the state machine waits (220) for the next control signal (222) to arrive (see also inputs CLK and SW ON to the control circuit (110) of FIG. 1) and further program (225) the device accordingly. If, on the other hand, the measured state does not match the desired/expected state (NO), then the state machine initially waits (230) for a cool-off time (of a predetermined length/duration) before programming (225) the switch again to obtain the desired/expected state. The presence of such programmable waiting time interval (i.e., cool-off time) is preferred in case of PCM devices, due to a maximum switching frequency that can be adopted for specific phase-change materials used in the PCM devices. Typical manufacturer-recommended cool-off time between programming ON and programming OFF the PCM device and vice versa may be of about a millisecond and up to few milliseconds.

Turning back now to the description of FIG. 1, the person skilled in the art will understand that reading and control arrangements for more than just a single switch device (e.g., 105) can be implemented. For example, as previously described, plural switch devices in the radio frequency (RF) field can usually be arranged either as through switches (between a first RF terminal and a second RF terminal) or shunt switches (between an RF terminal and a reference voltage, such as ground). This distinction is relevant for the purposes of the present disclosure, as establishment of a measurement path like path VDD-130-L1-P1 shown in FIG. 1, will require the path to terminate to ground, or to a known reference voltage, in order for the measurement to correctly occur. While a measurement current path to ground is inherently present in shunt switches, the present disclosure provides for the addition of resistive termination loads (e.g., 50 ohm termination loads) terminated to ground in case of through switches to allow such measurement to occur. Reference can be made to FIG. 3, which shows an embodiment of the present disclosure applied to a single-pole double-throw (SPDT) switch (see, e.g., U.S. Pat. No. 6,804,502 incorporated herein by reference in its entirety). In particular, the SPDT switch shown in FIG. 3 may selectively switch one of the RF1 or RF2 ports to a common port that is coupled to an output load (e.g., Rc). If desired, a portion of the circuit can be on-chip, while a separate portion (e.g. resistors R1, R2 and Rc) can be off-chip.

As schematically shown in FIG. 3, the SPDT switch includes through switches SW1, SW2 and shunt switches SW3, SW4, that may be partitioned into a first arm that includes switches (SW1, SW3) and a second arm that includes switches (SW2, SW4). By way of example, all such switches can be implemented as PCM devices. Coupled to each switch is a switch state reading arrangement, comprised of a current injecting FET Ti (i=1, 2, 3, 4) and a corresponding isolation inductor Li (i=1, 2, 3, 4). Additionally, as also previously explained, resistive loads R1 and R2 (e.g., 50 ohm resistors to ground) are respectively provided in correspondence of through switches SW1 and SW2 in order to allow for a more accurate/precise measurement of the switch resistances via reading arrangements T1, L1 and T2, L2.

With continued reference to FIG. 3, the person skilled in the art will understand that, when a reading arrangement for a plurality of switches is provided (e.g., four switches in the SPDT of FIG. 3), risk of interference among the various readings is high (since a measuring current can be conducted through unintended paths). As a consequence, in accordance with embodiments of the present disclosure, several implementations are undertaken to reduce or minimize such risk.

A first implementation provides for performing the measurement steps of the various switches sequentially, in separate measurement periods of time or, in other words, separate and distinct measurement time intervals. In case of an SPDT switch, such as one shown in FIG. 3 that includes a first arm (SW1, SW3) and a second arm (SW2, SW4), the following four steps could be separately followed in an ordered fashion: measurement of the state of SW3 (shunt switch of the first arm), measurement of the state of SW1 (through switch of the first arm), measurement of the state of SW4 (shunt switch of the second arm) and measurement of the state of SW2 (through switch of the second arm). Of course, other sequences are possible, as long as each of them is separate in time from the others.

A second implementation provides for the addition of auxiliary FET switches to help isolate each measurement. In particular, measurement of the state of a shunt switch (e.g., SW3 or SW4 of FIG. 3) of an arm can potentially be influenced by the presence of the through switch on the same arm and (in lesser fashion) by the presence of the through switch on the other arm, given the additional paths to ground established through their respective resistive loads once a reading current is injected into the shunt switch. Similarly, measurement of the state of a through switch (e.g., SW1 or SW2 of FIG. 3) of an arm can potentially be influenced by the presence of the through switch on the other arm and by the presence of the shunt switch on the same arm.

In particular, the second implementation provides for the presence of additional logic bypass and current injection timing circuit coupled to devices not currently measured, in order to reduce or minimize their interference, by a) bypassing their current and/or b) having extra current injected therein, to obtain a more accurate/precise (e.g., correct) reading from the device under measurement. Such additional logic bypass and current injection timing circuit will be now described in detail, with combined reference to FIG. 3 and FIG. 4.

When measuring a through switch of an arm, a path to ground for the measurement current that bypasses the shunt switch on the same arm is provided. This is initially shown in FIG. 3, through the presence of nMOS (transistor) bypass switches T5 and T6 provided in each shunt switch reading/measurement circuit, wherein such nMOS switches, differently from their corresponding T3 and T4 pMOS switches, are switched ON when a through switch on the same arm (i.e., SW1 or SW2) is read, respectively. In this way, the reading current from T1, L1 (or T2, L2), after passing through SW1 (or SW2), goes to ground through T5 (or T6) instead of passing through SW3 (or SW4).

In addition to the above, a further improvement of the process of measuring the state of a shunt switch is provided in accordance with a further embodiment of the present disclosure. In particular, current generated through T1 . . . T4 is injected into the SPDT switch not only for reading the state of respective switches SW1 . . . SW4 but also to inject current into resistors R1 and R2 outside of the reading time interval for a specific switch. In other words, when measuring e.g., a shunt switch via an associated reading/measurement circuit, additional current is injected into the external resistive loads (e.g., R1 and R2 in FIG. 3) of the through switches (SW1, SW2) via activation (through the control circuit (110) of FIG. 1) of the current sources of the respective associated reading/measurement circuits, so that such switches do not appear as shorts to the shunt switch reading/measurement circuit. Similarly, when the state of a through switch (e.g., SW1) of one arm is read, additional current is injected into the external resistive load of the through switches (e.g., SW2) of the other arms, so that the through switch and the shunt switch of the other arms do not appear as a shorts to the through switch reading/measurement circuit.

By way of example, with reference to the SPDT switch of FIG. 3 and assuming the presence of four measurement phases in correspondence of the four PCM devices/switches (SW1, SW2, SW3, SW4), the operation of respective logic circuits (e.g., circuit (110) of FIG. 1) may include the following sequence of operations:

Phase 1: Measurement of shunt switch SW3: inject reading current in SW3 (through control circuit for SW3) and inject current in external loads R1 and R2 (through control circuits for SW2 and SW3)

Phase 2: Measurement of through switch SW1: inject reading current in SW1 (through control circuitry for SW1), bypass SW3 (through control circuit for SW3) and inject current in external loads R1 and R2 (through control circuits for SW1 and SW4).

Phase 3: Measurement of shunt switch SW4: inject reading current in SW4 (through control circuit for SW4) and inject current in external loads R1 and R2 (through control circuits for SW1 and SW4).

Phase 4: Measurement of through switch SW2: inject reading current in SW2 (through control circuit for SW2), bypass SW4 (through control circuit for SW4) and inject current in external loads R1 and R2 (through control circuits for SW2 and SW3).

Figure 4:
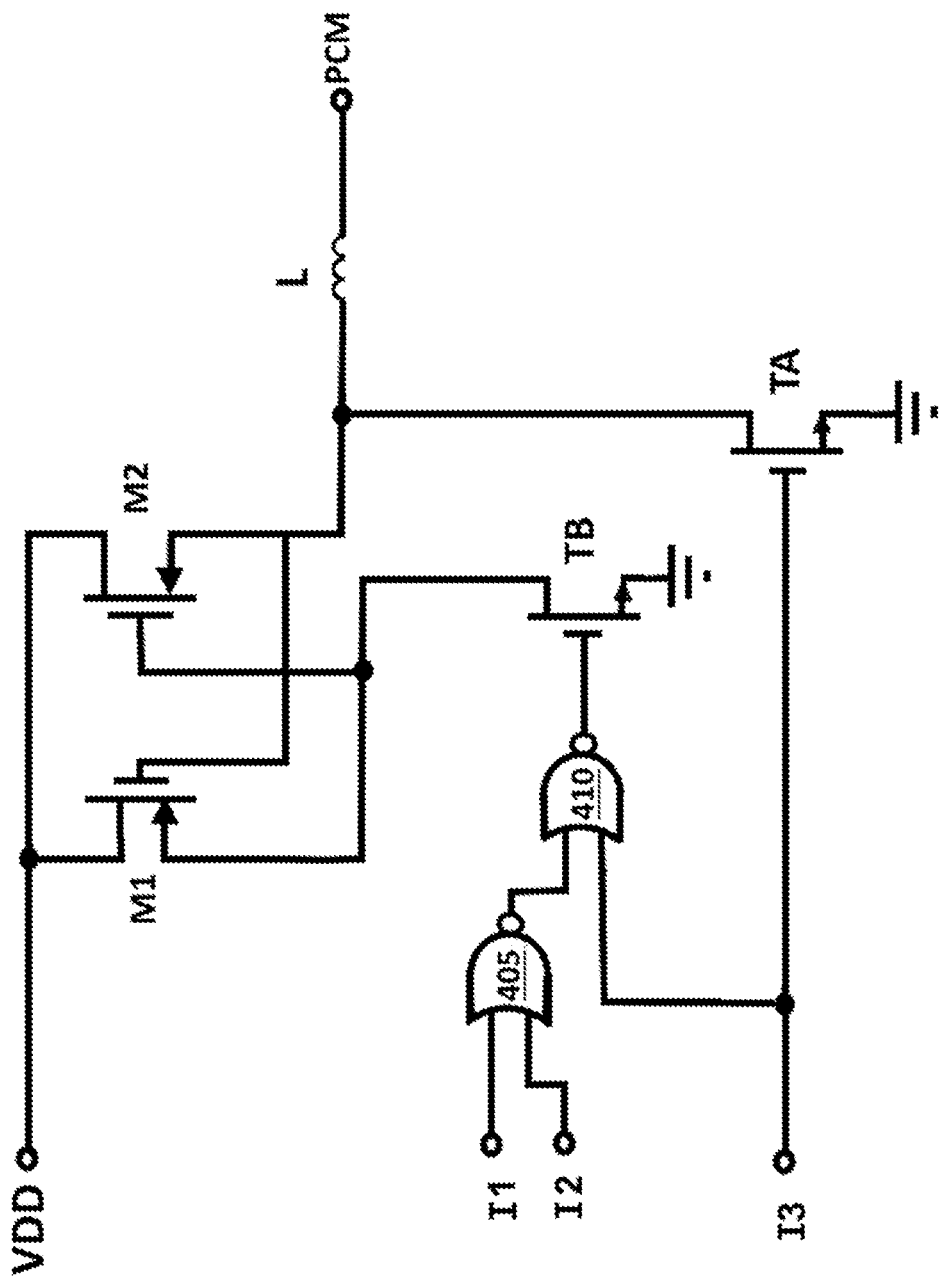
FIG. 4 shows an exemplary switch control circuit according to an embodiment of the present disclosure.

In order to be able to perform the above outlined sequences of operation, a more complex design may be provided for each switch control circuit, as shown in FIG. 4. In particular, the control arrangement of FIG. 4 can be adopted both in case of shunt switch control (compare with T3, T5 or T4, T6 of FIG. 3) and in case of through switch control (compare with T1 or T2 of FIG. 3). A detailed description of the structure and operation of the circuit of FIG. 4 will now follow.

As shown in FIG. 4, p-MOSFETs M1 and M2 provide a current source for current to be injected to a PCM device through inductor L.

The case where the circuit of FIG. 4 pertains to a shunt switch (e.g., switch SW3 of FIG. 3) will be described first. In such case, input I1 is asserted (I1=HIGH) when the state of the shunt switch to which the control circuit pertains (e.g., SW3) is being read. On the other hand, input I2 is asserted (I2=HIGH) when the state of the through switch on the opposite arm (in this case SW2) is being read. Finally, input I3 is asserted (I3=HIGH) when the state of the through switch on the same arm (in this case SW1) is being read.

In particular, assuming now that the circuit of FIG. 4 specifically pertains to shunt switch SW3, and making reference to the four exemplary phases described above:

In Phase 1, in order to read the state of shunt switch SW3, the shunt switch control circuit of FIG. 4 injects current in SW3 (and consequently in R1, R2 and Rc in an amount depending on the state of SW1 and SW2). This is a case where I1=HIGH, while I2=LOW and I3=LOW. The output of NOR logic gate (405) will be LOW, while the output of NOR logic gate (410) will be HIGH, thus turning (transistor) switch TB ON and enabling the current source formed by M1 and M2 to deliver current to the shunt switch SW3.

In Phase 2, when the state of through switch SW1 is being read, the shunt control circuit of the switch SW3 advantageously allows for the reading current coming from through switch SW1 (i.e., the through switch of the same arm) to bypass the switch SW3. This is a case where I1=LOW, while I2=LOW and I3=HIGH. The output of NOR (405) will be HIGH, while the output of NOR (410) will be LOW, thus turning switch TB OFF and not allowing current to be injected through the control circuit of the shunt switch SW3. However, I3=HIGH turns switch TA ON, thus creating a bypass path to ground for SW1's reading current entering the control circuit of the switch SW3, thus bypassing SW3.

In Phase 3, when the state of the other shunt switch SW4 is being read, all of I1, I2, and I3 of the control circuit of the switch SW3 are LOW. In such case both TA and TB are OFF, which means that no current is being injected by the control circuit of the switch SW3 and no bypass path is being formed for bypassing of the switch SW3.

In Phase 4, when the state of the through switch SW2 on the other arm is being read, I2 goes HIGH, thus turning switch TB ON and allowing injection of current into R1, R2 and Rc in an amount depending on the state of SW1 and SW2. This current injection is beneficial, because it will allow a more accurate/precise reading of the state of through switch SW2.

Similar observations can be made in case the circuit of FIG. 4 pertains to shunt switch SW4 of FIG. 3. It should be noted that the logic implemented by the NOR gates (405, 410) in the circuit shown in FIG. 4 may be implemented via other type of logic gates.

According to a further embodiment of the disclosure, the circuit of FIG. 4 can also be implemented as control circuit for a through switch (e.g., switch SW1 of FIG. 3). In such case, input I1 is asserted (I1=HIGH) when the state of the through switch to which the control circuit pertains is being read. On the other hand, input I2 is asserted (I2=HIGH) when the state of the shunt switch on the opposite arm (in this case SW4) is being read. Finally, input I3 is never asserted in case of a through switch (I3=LOW), which means that, differently from the control circuit of a shunt switch described above, the control circuit of a through switch does not have a need to create a bypass path. This aspect can also be generally seen from FIG. 3, where switches T5 and T6 are only provided in the control circuit for the shunt switches.

In particular, assuming now that the circuit of FIG. 4 specifically pertains to the through switch SW1, and making reference again to the four exemplary phases described above:

In Phase 1, where the state of shunt switch SW3 is being read, all of I1, I2 and I3 of the control circuit of SW1 are LOW. In such case, both TA and TB are OFF, which means that no current is being injected by the control circuit of the switch SW1.

In Phase 2, in order to read the state of through switch SW1, the through switch control circuit of FIG. 4 injects current in SW1 (and consequently in R1, R2 and Rc depending on the state of SW1 and SW2). This is a case where I1=HIGH, while I2=LOW and I3=LOW. The output of NOR (405) will be LOW, while the output of NOR (410) will be HIGH, thus turning the switch TB ON and enabling the current source formed by M1 and M2 to deliver current to the through switch SW1.

In Phase 3, where the state of the shunt switch SW4 on the opposite arm is being read, I2 goes HIGH, thus turning switch TB ON and allowing injection of current into R1, R2 and Rc depending on the state of SW1 and SW2. This current injection is beneficial, because it will allow a more accurate/precise reading of the state of the shunt switch SW4.

In Phase 4, where the state of the through switch SW2 is being read, all of I1, I2, and I3 of the control circuit of the switch SW1 are LOW. In such case both TA and TB are OFF, which means that no current is being injected by the control circuit of the switch SW1.

Similar observations can be made in case the circuit of FIG. 4 pertains to through switch SW2 of FIG. 3.

Turning back to the representation shown in FIG. 1, the ADC may be implemented through at least one comparator, providing a first digital value for voltages below a certain (preset) level ("trip point") and a second digital value for voltages above such level. Given that the resistive value read by the arrangement of FIG. 1 is not read in isolation as the switch under observation may be coupled to other circuits such as the resistive loads discussed above, the person skilled in the art will understand that the trip point may be chosen with some care in dependence of overall circuit topology, including for example, values and disposition of other components in the circuit under measure.

Figure 5:
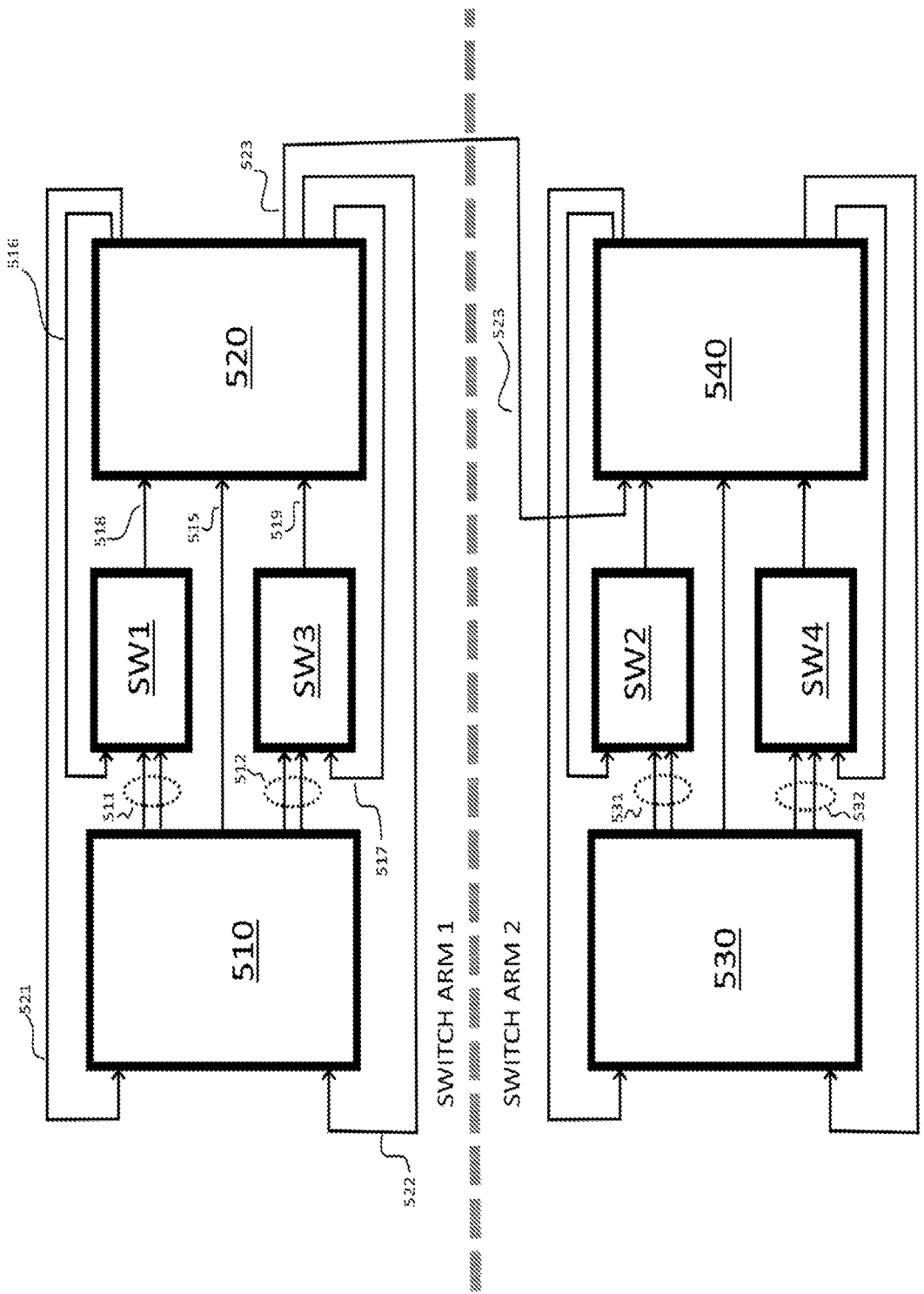
FIG. 5 shows various control processing steps performed by state machines for controlling and testing operation of the SPDT switch circuit of FIG. 3 in accordance with an embodiment of the present disclosure.

Reference will now be made to FIG. 5, which shows a series of control processing steps, implemented by a (respective) state machine controller, in case of the previously discussed (branches of the) SPDT switch. The processing steps and related controllers represent a specific example of the general process previously discussed with reference to FIG. 2.

A first state control machine (510) and a first BIST (520) are provided for the through and shunt switches SW1, SW3 of the first arm, while a second state control machine (530) and second BIST (540) are provided for the through and shunt switches SW2, SW4 of the second arm.

Each state control machine (510, 530) include outputs (511, 512) and (531, 532) controlling ON state and OFF state programming of each switch. Once (an attempt for) programming of switches SW1 and SW3 is completed, the state control machine (510) outputs a "done" signal (515) to start operation of BIST (520) for testing/checking/validating success of the programming. In this case, BIST (520) sends measuring signals (516, 517) to the switches SW1 and SW3, responsive to which the switches SW1 and SW3 output result signals (518, 519)—i.e. the digital results of the measurement after the analog-to-digital conversion- to BIST (520). If BIST (520) determines that the (attempt for) programming of the switches SW1 and/or SW3 as unsuccessful (see also decision step (215) of FIG. 2), it is going to assert one or both "again" signals (521, 522) (one for each switch) to the state control machine (510) and start the process again by programming the switch or switches one more time. Any one of the "again" signals (521, 522) may be asserted (and reasserted) in case of no success in programming of an associated switch. Once the process ends for the first arm switches SW1 and SW3 (i.e. successful programming), control is transferred to the controllers (530, 540) below through a signal (523) output by the BIST (520), thus allowing the entire process to be cascaded to a larger number of switches than just two and then daisy-chained back to the initial switch or switches. Operation of such additional controllers is similar to the one described above and will not be discussed here in detail.

As noted in FIGS. 2 and 5 above, there are cases where the measured state of a switch (e.g., a MEMS or PCM switch) does not match its desired/expected state (unsuccessful attempt in programming), thus requiring (possibly after a cool-off time) a further programming of the switch in the attempt of forcing the switch away from its current state and into the desired/expected state. This was shown in boxes (225, 230) of FIG. 2 and related written description, and is shown in FIG. 5 by implementation of the "again" signals (521, 522) sent by BIST (520) to state control machine (510). The following FIG. 6 will show, in more detail, a timing diagram related to various control signals used in the operation of the SPDT switch of FIG. 3.

Figure 6:
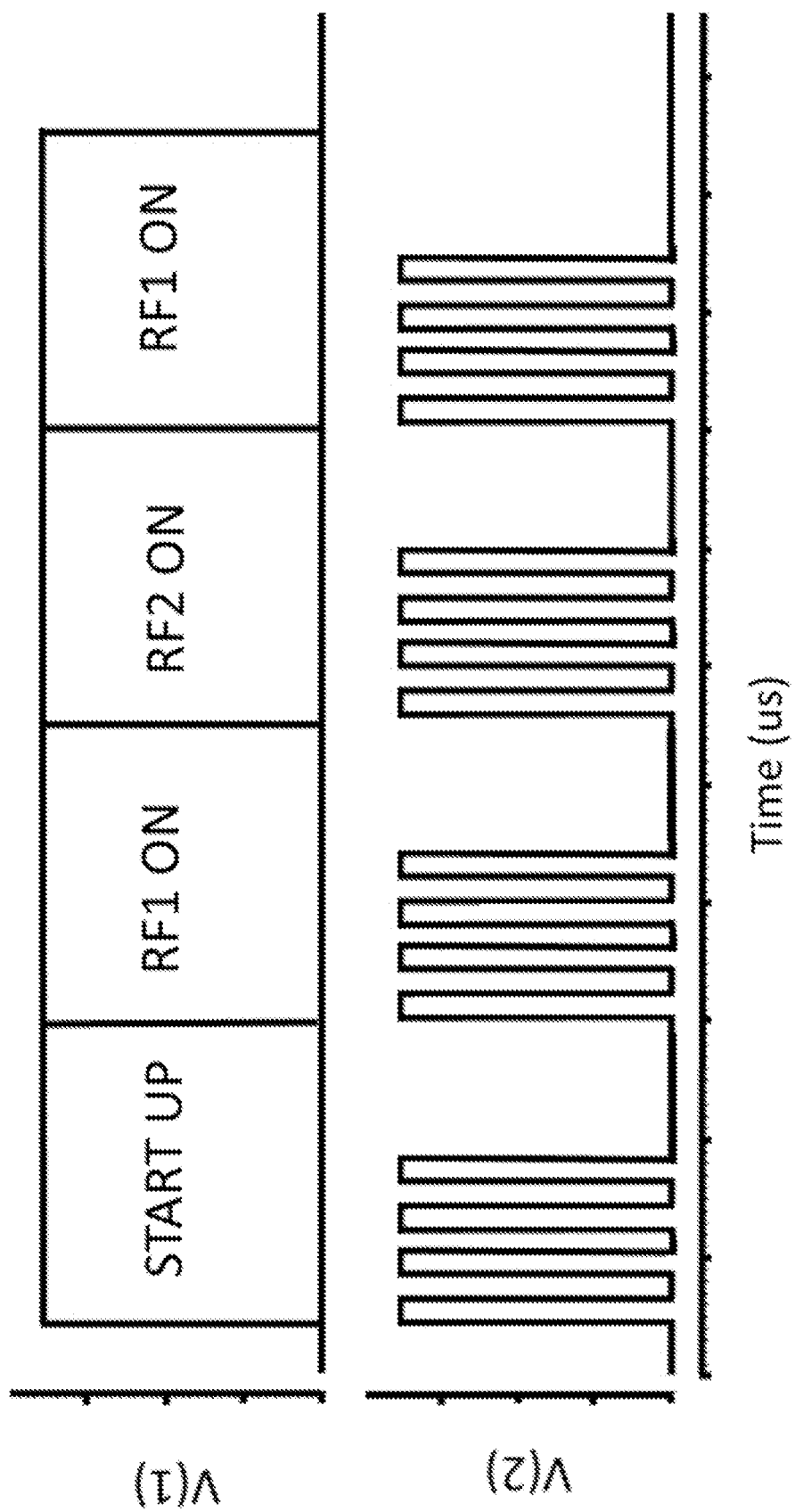
FIG. 6 shows a timing diagram related to various control signals used in the operation of the SPDT switch of FIG. 3.
Figure 7:
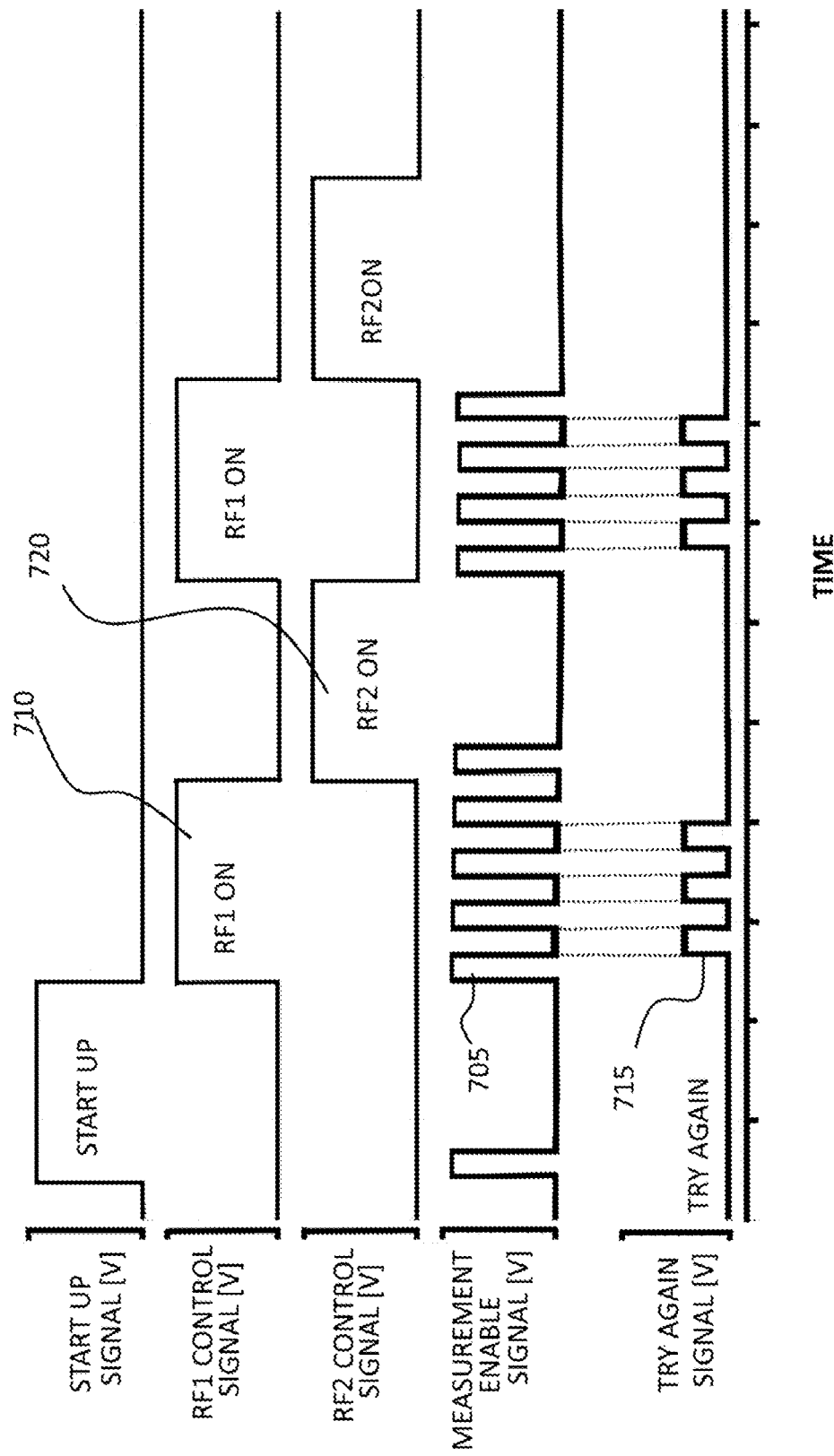
FIG. 7 shows a timing diagram related to various control signals in case of unsuccessful programming of a switch device in accordance with an embodiment of the present disclosure.

The top portion of the timing diagram of FIG. 6 corresponds to a superposition of control signal pulses representative of the status of the SPDT switch as asserted through the output of the bus controller (115) of FIG. 1. These include a Startup state, a RF1ON state, and a RF2ON state, wherein each such state may be asserted through a corresponding control signal (e.g., a pulse) that may be set to, for example, a HIGH level during the state (and a LOW level during a different state, as shown in FIG. 7 later described). As shown in FIG. 6, after a startup state, the states of the SPDT switch may include, for example, a state, RF1ON, defined by the RF1 input of the SPDT switch being connected to the output of the SPDT switch, and a state, RF2ON, defined by the RF2 input of the SPDT switch being connected to the output of the SPDT switch. It should be noted that after the Startup state, any sequencing of states RF1ON and RF2ON may be provided via the bus controller (115) of FIG. 1 in dependence of an intended use of the SPDT switch in a corresponding circuit.

As shown in the bottom portion of the timing diagram of FIG. 6, for each change of state, the (sequence of the) four measurement phases described above may be performed (e.g. measurement of state of through switch SW1 of arm 1, measurement of state of shunt switch SW3 of arm 1, measurement of state of through switch SW2 of arm 2, and measurement of state of shunt switch SW4 of arm 2), in order to establish and/or ascertain the state of each of the switches that make up the (arms of the) SPDT switch. For example, during the Startup state, the four measurement phases may be used to establish the respective states of the switches (SW1, SW2, SW3, SW4) whereas after transition into an operational state (e.g., RF1ON or RF2ON), the four measurement phases may be used, in combination with the above described programming pulses (not shown in FIG. 6), to ascertain the respective states of the switches (SW1, SW2, SW3, SW4) as dictated by the specific operation of the SPDT switch.

Reference will now be made to the timing diagram of FIG. 7, which shows a scenario of an unsuccessful programming of a switch (e.g., SW3 of FIG. 3) for operation of the SPDT switch of FIG. 3 according to the RF1ON state. In particular, the unsuccessful programming may be obtained (e.g., simulated, forced), for example, by intentionally reducing a supply voltage so that (e.g., through the associated driver 120/125 of FIG. 1) it does not have enough power to perform programming of a specific shunt switch (e.g., SW3 of FIG. 3) for operation in the RF1ON state. In other words, such scenario intentionally prevents the shunt switch (e.g., SW3 of FIG. 3) from switching in the OFF state that is required for operation of the SPDT switch of FIG. 3 according to the RF1ON state. It should be noted that in the timing diagram of FIG. 7, and in contrast to the timing diagram of FIG. 6, the Startup, RF1ON, and RF2ON control signals are shown separated.

According to the above scenario, and with continued reference to FIG. 7, when a state of the shunt switch (e.g., SW3 of FIG. 3) is measured (705) during the time interval (710) of the RF1ON state of the system (e.g., of the SPDT switch of FIG. 3), its state is not as desired/expected (e.g., wrong). As a consequence, a "try again" signal (715) is asserted (see also "again" signals 521, 522 in FIG. 5) after the measurement (705), and the shunt switch (e.g., SW3 of FIG. 3) is programmed again (through, e.g., heater voltage programming pulses in case of a PCM switch, not shown in the figure). This process, including the sequence of programming, measuring and trying again, is repeated until the switch (e.g., SW3 of FIG. 3), is found to be in the desired/expected state. However, in this specific scenario and as shown in FIG. 7, given that there is not enough supply voltage to program the switch to its desired/expected state, the "try again" signal (715) is repeatedly asserted throughout the time interval (710) of the RF1ON state. On the other hand, when the system switches to the RF2ON state, the shunt switch (e.g., SW3 of FIG. 3) is in the desired/expected state (i.e., ON state) throughout the time interval (720) of the RF2ON state, and therefore, as shown in FIG. 7, a single measurement pulse (705) may be sufficient to detect the desired/expected state of the shunt switch (see also absence of additional programming and try again pulses in that state). The behavior in case of a faulty through switch is similar.

It should be noted that, if desired, the control machine can be configured to provide a "retry_max" signal that may be asserted when a counter that is configured to count a number of retries for programming of a specific switch (e.g., any one of SW1, SW2, SW3 or SW4 of FIG. 3) reaches a predetermined high count value (e.g., 32). Once the "retry_max" signal is asserted, the state machine may stop programming of the switch and report a (switch specific) failure to the controller.

As noted with reference to the description of FIG. 1, embodiments where the ADC converter has more than one bit can be provided. By way of example, several kinds of switch devices, including PCM devices, change characteristics over time. After a certain number of cycles, there may be a change and different variability in the Ron resistance of a switch device. In such cases, identification of the correct threshold to be able to distinguish between an ON state and an OFF state of the switch may be performed not by via a single-bit ADC having an ON or OFF value, but instead via a multi-bit value (e.g., digital word) to increase the resolution of the resistance measurement. In turn, such multi-bit value can be used as feedback to allow controlling/programming of the switch to obtain a desired Ron resistance value of the switch. Such controlling/programming may be provided by adjusting specific parameters, including pulse duration and/or injection current or voltage, of (programming) pulses to the switch.

According to an alternative embodiment of the present disclosure, instead of measuring an operational switch device (e.g., one that is effectively used to switch in/out an RF signal), a replica switch device (also representable through reference numeral 105 of FIG. 1) (e.g., one that is not coupled to the RF signal) corresponding to the operational switch device can be measured, in which case there would be no need for isolation, such as an isolation inductive arrangement. In such case, the replica switch device may be subjected to a same number of ON-OFF or OFF-ON switching cycles as the operational switch devices. In a further alternative embodiment, the measurement discussed so far can be implemented only for a production test.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies.

However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A switch circuit arrangement, comprising:
   a control circuit;
   a plurality of measurement circuits coupled to the control circuit, each measurement circuit comprising a current source; and
   a corresponding plurality of switches respectively coupled to measurement circuits of the plurality of measurement circuits,
wherein the control circuit comprises a read mode of operation that is configured, selected switch by selected switch, to:
   i) activate the current source to inject current through the selected switch, and
   ii) based on the current injected through the selected switch, read, through the measurement circuit, a resulting voltage to measure a programming status of the selected switch;
wherein the read mode of operation is a sequential read mode of operation; and
wherein the plurality of switches are arranged to include through switches and shunt switches, wherein
   each through switch has a first through switch terminal coupled to a respective measurement circuit and a second through switch terminal, the first through switch terminal and the second through switch terminal configured to be selectively coupled to an RF signal, and
   each shunt switch has a first shunt switch terminal coupled to a respective measurement circuit and configured to be selectively coupled to the RF signal and a second shunt switch terminal coupled to a reference voltage or ground.

2. The switch circuit arrangement of claim 1, wherein each measurement circuit further comprises a single bit or multi-bit analog-to-digital converter, configured to convert an analog value of the resulting voltage to a digital value to be fed to the control circuit.

3. A switch circuit arrangement, comprising:
   a control circuit;
   a plurality of measurement circuits coupled to the control circuit, each measurement circuit comprising a current source; and a corresponding plurality of switches respectively coupled to measurement circuits of the plurality of measurement circuits, wherein the control circuit comprises a read mode of operation that is configured, selected switch by selected switch, to:
   i) activate the current source to inject current through the selected switch, and
   ii) based on the current injected through the selected switch, read, through the measurement circuit, a resulting voltage to measure a programming status of the selected switch;

wherein the plurality of switches are arranged to function as a radio frequency (RF) switch and include through switches and shunt switches, wherein
   each through switch has a first through switch terminal coupled to a respective measurement circuit and a second through switch terminal, the first through switch terminal and the second through switch terminal configured to be selectively coupled to an RF signal, and
   each shunt switch has a first shunt switch terminal coupled to a respective measurement circuit and configured to be selectively coupled to the RF signal and a second shunt switch terminal coupled to a reference voltage or ground.

4. The switch circuit arrangement of claim 3, further comprising termination loads coupled to respective through switches, the termination loads establishing a conductive path to ground for the current injected through each selected through switch during the read mode of operation.

5. The switch circuit arrangement of claim 4, wherein the read mode of operation is a sequential read mode of operation, the read mode occurring in separate time intervals for different selected through switches and shunt switches.

6. The switch circuit arrangement of claim 5, wherein the measurement circuits for shunt switches each include a bypass transistor configured to provide a conductive path to ground during measurement of the state of through switches.

7. The switch circuit arrangement of claim 5, wherein the RF switch is a single-pole double-throw (SPDT) switch, including two through switches and two shunt switches.

8. The switch circuit arrangement of claim 7, wherein the sequential read mode of operation comprises four separate time intervals for the measuring of the state of the two through switches and the two shunt switches.

9. The switch circuit arrangement of claim 8, wherein:
   the SPDT switch includes a first branch comprising a first through switch and a first shunt switch, and a second branch comprising a second through switch and a second shunt switch, and
   the plurality of measurement circuits comprise a measurement circuit for the first through switch, a measurement circuit for the first shunt switch, a measurement circuit for the second through switch, and a measurement circuit for the second shunt switch.

10. The switch circuit arrangement of claim 9, wherein measurement circuit for the first shunt switch and the measurement circuit for the second shunt switch each include a bypass transistor configured to provide, during the read mode of operation, a conductive path to ground during respective measurement of the state of the first through switch and the second through switch.

11. The switch circuit arrangement of claim 10, wherein, during measurement of the state of the first shunt switch and the second shunt switch, the control circuit is configured to activate the current source of the measurement circuit coupled respectively to the second through switch and the first through switch, thereby injecting current into the termination loads coupled to the first through switch and the second through switch.

12. The switch circuit arrangement of claim 1, further comprising:
   driver circuits coupled to the control circuit and the plurality of switches, wherein the control circuit further comprises a program mode of operation that is configured, selected switch by selected switch, to:
   i) generate first control pulses, provided to a driver circuit to program each selected switch to an ON state; and
   ii) generate second control pulses, provided to a driver circuit to program each selected switch in an OFF state.

13. The switch circuit arrangement of claim 12 wherein, for each selected switch, the driver circuit comprises;
   a first driver to process the first control pulse to program the selected switch in the ON state; and
   a second driver to process the second control pulse to program the selected switch in the OFF state.

14. The switch circuit arrangement of claim 12, wherein the control circuit is further configured to:
   receive a command to set a selected switch to a desired state according to one of the ON state or the OFF state,
   determine the state of the selected switch via the read mode of operation, and
   program the selected switch via the program mode of operation if the state of the selected switch is determined not to be the desired state.

15. The switch circuit arrangement of claim 14, wherein the control circuit is further configured to:
   determine again the state of the plurality of switches via the read mode of operation after the program mode of operation, and
   program again one or more switches of the plurality of switches via the program mode of operation if the state of the one or more switches is determined again not to be the desired state.

16. The switch circuit arrangement of claim 15, wherein the read mode of operation and the program mode of operation of the control circuit operate as a state machine.

17. The switch circuit arrangement of claim 1, wherein the plurality of switches are part of a radio frequency (RF) circuit and wherein each measurement circuit further comprises an RF isolation inductive arrangement.

18. The switch circuit arrangement of claim 1, wherein the plurality of switches are phase-change material (PCM) switches.

19. The switch circuit arrangement of claim 1, wherein the plurality of switches are micro-electromechanical system (MEMS) switches.

20. The switch circuit arrangement of claim 3, wherein the read mode of operation is a sequential read mode of operation, the read mode occurring in separate time intervals for different selected switches.

* * * * *